(12) United States Patent
Veeramachaneni et al.

(10) Patent No.: US 6,982,589 B2
(45) Date of Patent: Jan. 3, 2006

(54) MULTI-STAGE MULTIPLEXER

(75) Inventors: Venkat S. Veeramachaneni, Hillsboro, OR (US); Dinesh Somasekhar, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 922 days.

(21) Appl. No.: 09/796,072

(22) Filed: Feb. 28, 2001

(65) Prior Publication Data

US 2002/0118708 A1 Aug. 29, 2002

(51) Int. Cl.
*H03K 17/62* (2006.01)

(52) U.S. Cl. .......................... 327/408; 327/410; 327/99
(58) Field of Classification Search ............. 327/99, 327/379, 387, 388, 403, 404, 407–413, 427, 327/437
See application file for complete search history.

(56) References Cited

U.S. PATENT DOCUMENTS

| | | | | |
|---|---|---|---|---|
| 4,593,390 A | * | 6/1986 | Hildebrand et al. | 370/541 |
| 4,709,173 A | * | 11/1987 | Nishimichi et al. | 327/408 |
| 5,045,714 A | * | 9/1991 | Park et al. | 326/104 |
| 5,189,668 A | * | 2/1993 | Takatori et al. | 370/427 |
| 5,396,127 A | * | 3/1995 | Chan et al. | 326/44 |
| 5,543,731 A | | 8/1996 | Sigal et al. | 326/40 |
| 5,572,535 A | * | 11/1996 | Pixley et al. | 714/724 |
| 5,598,110 A | * | 1/1997 | Chang | 326/60 |
| 5,805,477 A | * | 9/1998 | Perner | 708/232 |
| 5,898,319 A | * | 4/1999 | New | 326/41 |
| 6,078,191 A | * | 6/2000 | Chan et al. | 326/40 |
| 6,194,950 B1 | * | 2/2001 | Kibar et al. | 327/410 |
| 6,323,715 B1 | * | 11/2001 | Vatinel | 327/407 |
| 6,425,068 B1 | * | 7/2002 | Vorbach et al. | 712/18 |

OTHER PUBLICATIONS

N. Weste et al., "Principles of CMOS VLSI Design", pp. 17–18, 1993, USA.
Jan Rabaey, "Digital Integrated Circuits", pp. 455–456, 1996, USA.
W. Dally et al., "Digital Systems Engineering", pp. 525–526, 1998, USA.

* cited by examiner

Primary Examiner—Timothy P. Callahan
Assistant Examiner—Hai L. Nguyen
(74) Attorney, Agent, or Firm—Fish & Richardson P.C.

(57) ABSTRACT

A multiplexer includes a first stage that has tri-state buffers each of which has split outputs and a final stage that has a tri-state buffer with an output. The multiplexer includes circuitry configured to enable or disable a signal at an input of a selected one of the first-stage buffers to propagate to the output of the final-stage buffer.

22 Claims, 5 Drawing Sheets

MULTI-STAGE MULTIPLEXER

BACKGROUND

The invention relates to multi-stage multiplexers.

In a typical multiplexer, a signal on a control input selects one of multiple input lines, enabling a signal on the selected input line to propagate to the multiplexer's output.

DETAILED DESCRIPTION

Figure 1A:
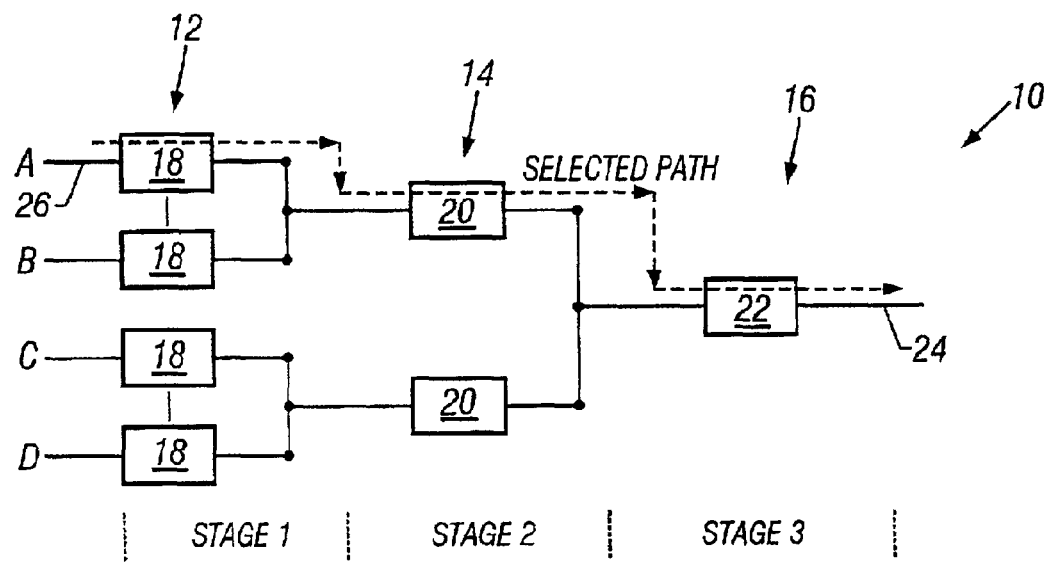
FIGS. 1A, 1B and 2 show multi-stage multiplexers.

As shown in FIG. 1A, a static multi-stage multiplexer 10 includes a first stage 12, one or more intermediate stages 14, and a final stage 16. A static multiplexer does not have a pre-charge phase. Each stage includes one or more tri-state buffers. As illustrated in FIG. 1A, the first stage 12 includes four buffers 18, the intermediate stage 14 includes two buffers 20, and the final stage 16 includes a single buffer 22. In other implementations, a particular stage may include a different number of buffers from the number of buffers illustrated in FIG. 1A. Furthermore, in some implementations, there may be no intermediate stages 14.

Each buffer 18 in the first stage can receive a signal at its input 26. For example, if the multiplexer 10 forms part of an arithmetic logic unit (ALU), the first-stage buffers 18 can be coupled to receive outputs from arithmetic or binary logic circuits (not shown in FIG. 1A). Each buffer in subsequent stages 14, 16 can be arranged to receive an output either from other circuits in the ALU or from a buffer in a previous stage of the multiplexer. As shown in FIG. 1A, each buffer 20 in the intermediate stage 14 is arranged to receive a signal from a selected one of the first stage buffers 18. The final-stage buffer 22 is arranged to receive a signal from a selected one of the intermediate stage buffers 20.

Control signals (not shown in FIG. 1A) are provided to each buffer 18, 20, 22 so that the buffer either is enabled or disabled. When a buffer is enabled, it passes the signal received at its input to its output. Conversely, when a buffer is disabled, the buffer is in a tri-state or floating state, such that the input signal does not appear at the buffer's output. By supplying appropriate control signals to the buffers, a particular input data signal (A, B, C or D) can be selected so that it appears at the output 24 of the multiplexer 10. The dashed line indicates the path through the multiplexer 10 along which an input signal would flow if the data signal A were selected.

Figure 1B:
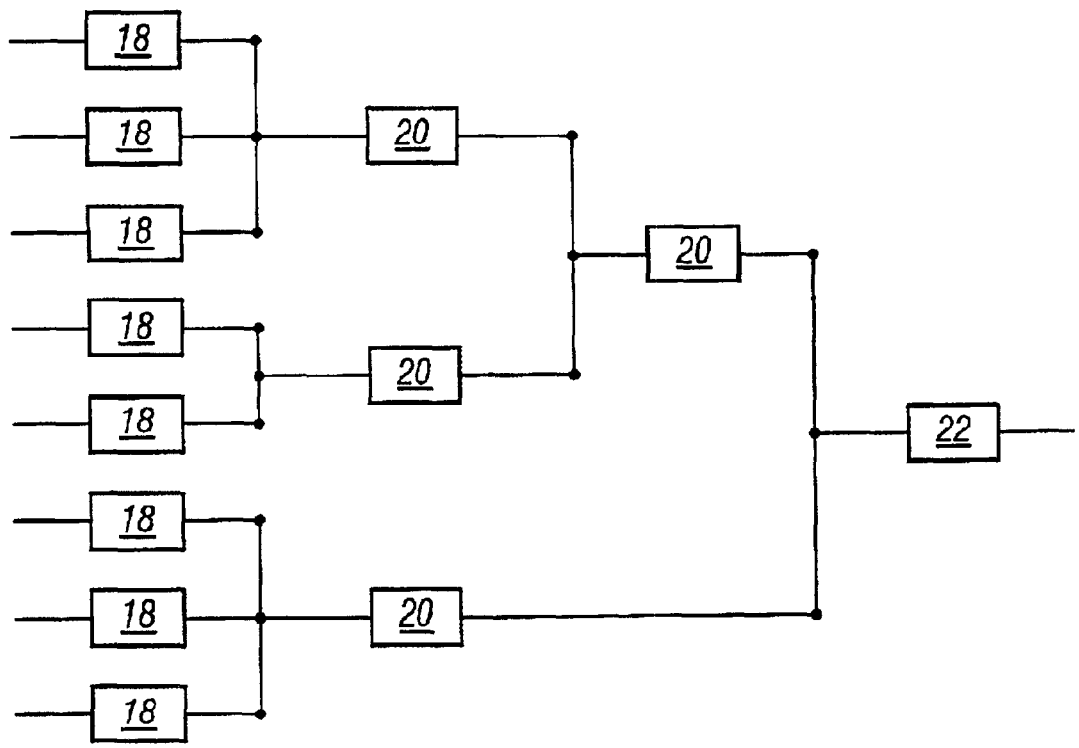

Although FIG. 1A shows only a single intermediate stage 14, additional cascaded intermediate stages can be added as shown in FIG. 1B.

Figure 2:
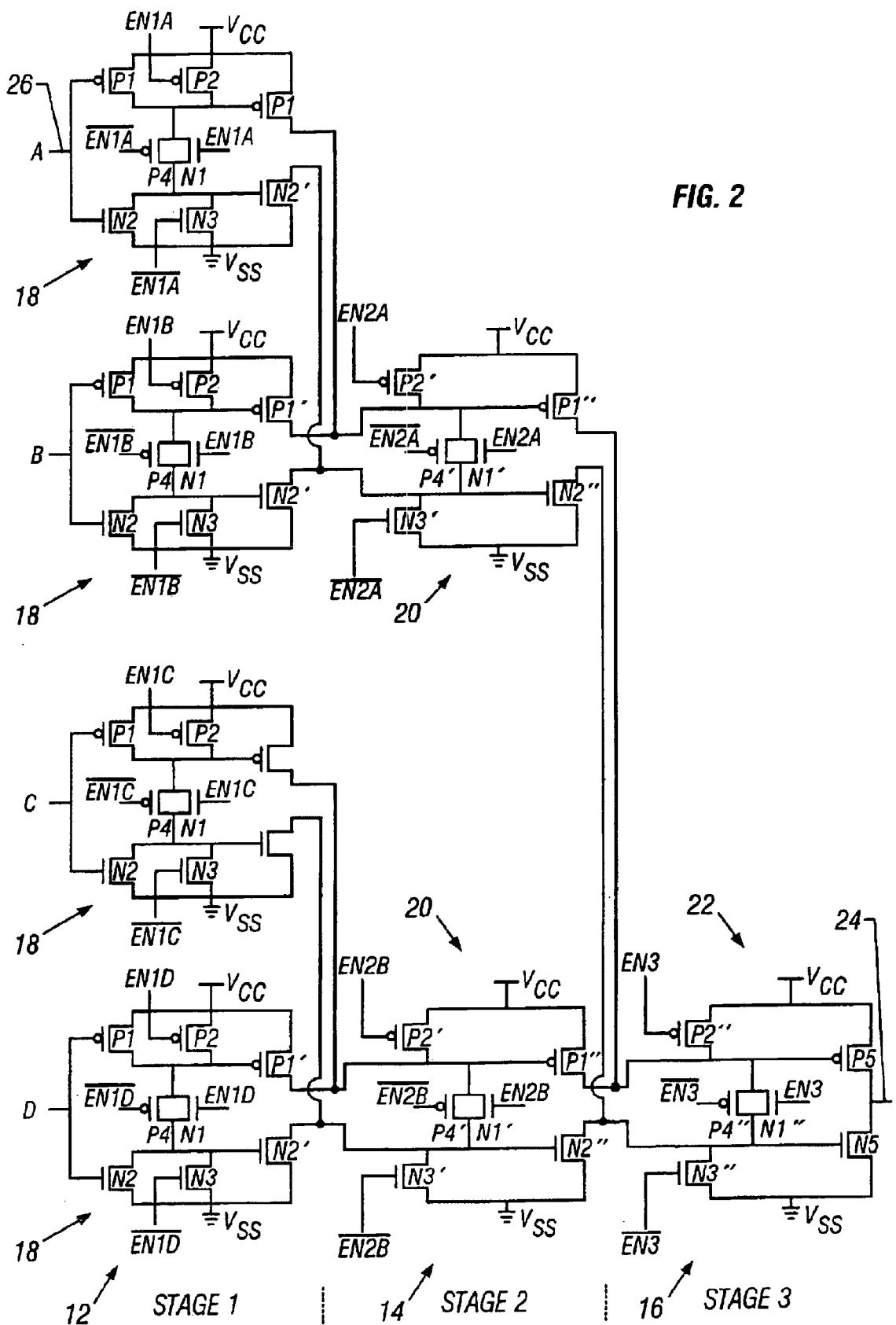
Figure 3:
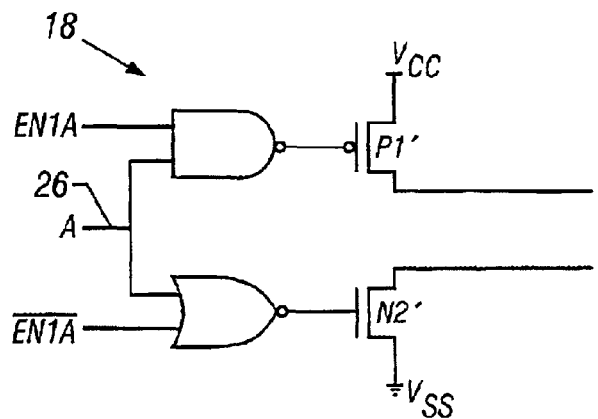
FIG. 3 illustrates the functionality of a first-stage buffer in the multiplexer.

Details of the buffers for each stage are illustrated in FIG. 2. Each buffer 18 in the first stage 12 includes four p-type metal-oxide-semiconductor (PMOS) transistors P1, P2, P4 and P1' and four n-type metal-oxide-semiconductor (NMOS) transistors N1, N2, N3 and N2'. The input 26 to a buffer 18 (for example, signal A) is coupled to the gates of transistors P1 and N2. The buffer 18 is coupled to a supply voltage ($V_{CC}$) and to ground ($V_{SS}$). The transistors P4 and N1 form a transmission gate. The combination of transistors P1, P2, N2 and N1 functions as a NAND gate, whereas the combination of transistors N2, N3, P4 and P1 functions as a NOR gate. Therefore, each buffer 18 in the first stage 12 functions as shown in FIG. 3 with split outputs provided from transistors P1' and N2'. In particular, the drains of transistors P1' and N2' are segregated.

Figure 4:
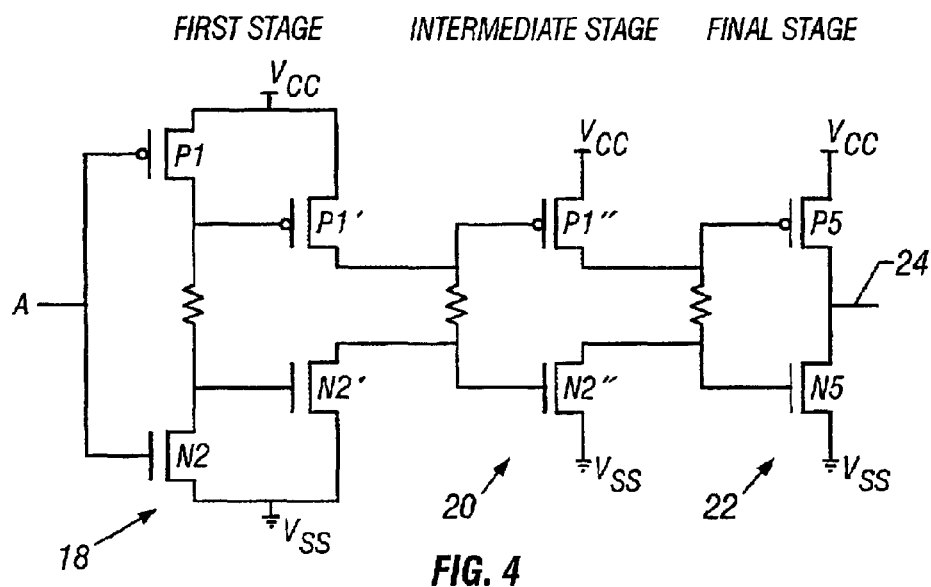
FIG. 4 illustrates the effective structure of enabled stages in the multiplexer.
Figure 5A:
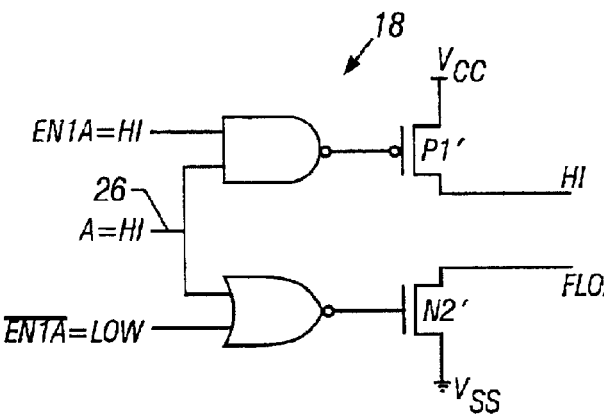
FIGS. 5A through 5D illustrate the relationship between input, control and output signals for the first-stage buffers.
Figure 5B:
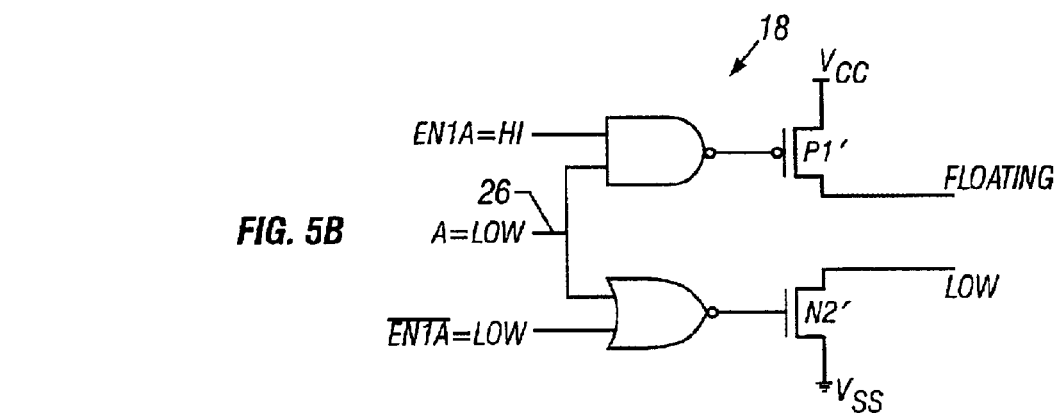

Each first-stage buffer 18 is controlled by respective enable/disable signals. For example, the upper buffer 18 in FIG. 2 is enabled or disabled based on the control signals EN1A and $\overline{EN1A}$, where $\overline{EN1A}$ is the complement of EN1A. To select a particular buffer 18, the control signals for the particular buffer are asserted. For example, to select the upper buffer 18 in FIG. 2, the signal EN1A is set to a digital high, and the signal $\overline{EN1A}$ is set to a digital low. When the control signals are asserted, the transistors P4 and N1 of the transmission gate are turned on, and the transistors P2 and N3 are turned off. Thus, the signals driving the gates of the transistors P1' and N2' are enabled, and the buffer's output follows the buffer's input. The effective circuit that is presented for a first-stage buffer 18 when the buffer is enabled is shown in FIG. 4. As shown in FIGS. 5A and 5B, when a first-stage buffer 18 is enabled, one of the split outputs from the selected first-stage buffer 18 will be a non-inverted version of the input signal; the other output from the selected first-stage buffer will be floating.

Figure 5C:
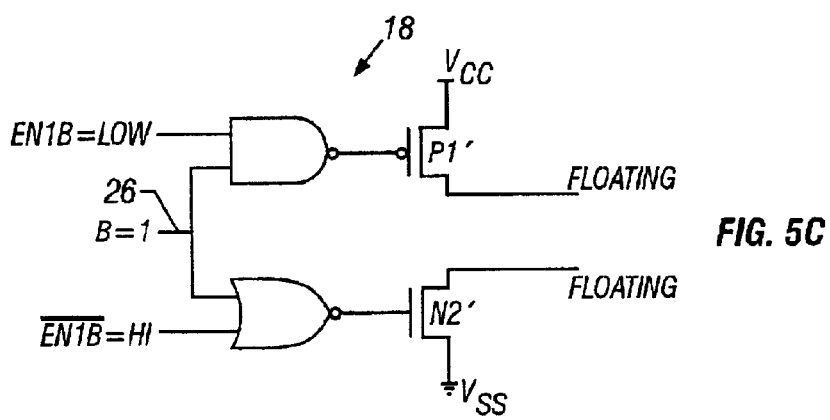
Figure 5D:
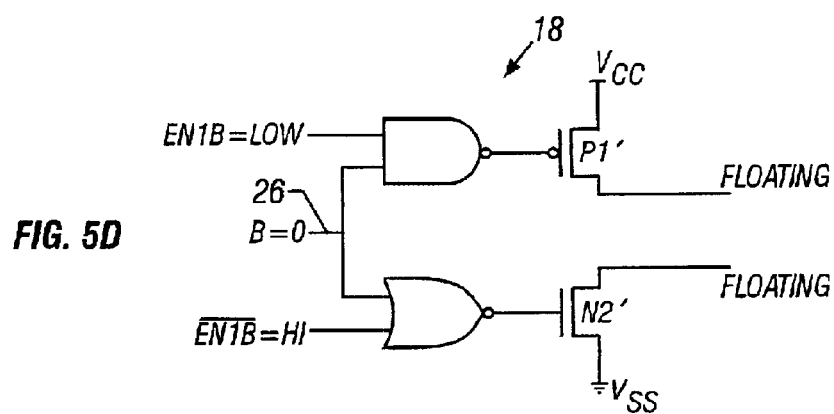

The non-selected first-stage buffers 18 are disabled by de-asserting their control signals. For example, if the upper first-stage buffer 18 is selected, the other first-stage buffers are disabled by de-asserting the control signals EN1B, EN1C and EN1D. By de-asserting the control signal, the gate of transistor P1' is driven high and the gate of transistor N2' is driven low, thereby turning off those devices. In that case, both segregated outputs of the first-stage buffer 18 will be floating regardless of the value of the data signal B, as shown in FIGS. 5C and 5D.

As shown in FIG. 2, each intermediate-stage buffer 20 includes three PMOS transistors P2', P4' and P1" and three NMOS transistors N1', N3' and N2". The configuration of the intermediate-stage buffers 20 is similar to that of the first-stage buffers 18, except that the outputs from the previous stage are coupled, respectively, directly to the gates of transistors P1" and N2". The intermediate-stage buffers do not have transistors corresponding to transistors P1 and N2. The intermediate-stage buffers 20, therefore, can use two fewer transistors than the first-stage buffers 18.

The intermediate-stage buffers 20, like the first-stage buffers 18, have a split output. As shown in FIG. 2, the drains of transistors P1" and N2" are not electrically tied together. The combination of transistors P2' and N1' from the intermediate-stage buffer 20 together with transistors N2' and P1' from the selected first-stage buffer 18 function as a NAND gate. Similarly, the combination of transistors, N3' and P4' from the intermediate-stage buffer 20 together with transistors N2' and P1' from the selected first-stage buffer 18 function as a NOR gate.

To select an intermediate-stage buffer 20, the control signal (e.g., EN2A) for the particular buffer is asserted, thereby activating the transmission gate formed by transistors P4' and N1' and shorting together the split output lines from the selected first-stage buffer. The effective circuit that is presented for an intermediate-state buffer 20 when the buffer is enabled is shown in FIG. 4. One of the split outputs from the selected intermediate-stage buffer 20 will be a non-inverted version of the input signal; the other output from the selected intermediate-stage buffer will be floating.

When an intermediate-stage buffer 20 is deactivated by de-asserting its control signals, the split outputs from the selected first-stage buffer 18 are driven to the rails. In particular, the output line of transistor P1' is driven to the supply voltage $V_{CC}$, and the output line of transistor N2' is driven to $V_{SS}$. In general, deactivating a particular stage of the multiplexer 10 causes the split outputs from the previous stage(s) that are driving the particular stage to be forced to the rails, thereby preventing any input transitions from propagating through the multiplexer.

The output lines from buffers 20 in the last intermediate stage 14 are coupled to the final stage 16, which, as shown in FIG. 2, includes a single tri-state buffer 22. The buffer 22 is similar to the intermediate-state buffers 20, except that the outputs of the last stage are shorted together. In other words, the drains of transistors P5 and N5 are electrically tied together to provide a single output signal on line 24. The final-stage buffer 22 can be enabled or disabled using the control signal EN3 and its complement $\overline{EN3}$. For example, when the control signal is asserted, the transmission gate formed by transistors P4" and N1" is activated and the split output lines from the selected intermediate-stage buffer 20 are shorted together. The effective circuit that is presented for the final-stage buffer 22 when the buffer is enabled is shown in FIG. 4. The output from the final-stage buffer 22 is inverted with respect to its non-floating input.

The multiplexer 10 described above can be particularly advantageous for driving heavily-loaded lines. Splitting the lines in each stage (other than the final stage) allows multiple stages to be cascaded together in a wide multiplexer. Using only a single stack at the output of each stage (i.e., a single transistor between the power line and the stage's output) allows heavier loads to be accommodated on the output line 24. The multiplexer design can use fewer transistors than some prior designs. In particular, the intermediate-stage and final-stage buffers can use only six transistors. That can result in lower manufacturing costs and also smaller propagation delays. Short-circuit currents can be reduced.

Figure 6:
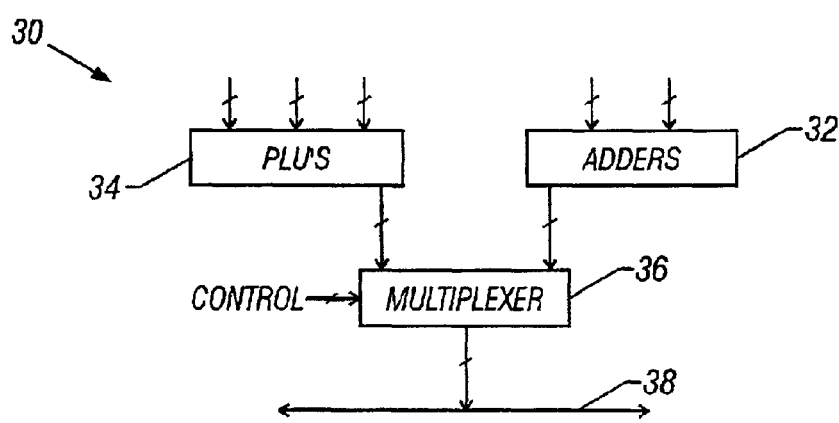
FIG. 6 is a block diagram of an arithmetic logic unit (ALU).

The multi-stage multiplexer 10 can be used to select an input line from among many input lines and to provide the signal from the selected line onto a common bus. For example, a multi-stage multiplexer can be incorporated into an ALU in a microprocessor. As shown in FIG. 6, an ALU 30 may perform various functions including arithmetic, binary logic and equality comparison. The ALU 30 may include adders 32 that can perform arithmetic operations such as addition and subtraction. The ALU 30 also can include programmable logic units (PLUs) 34 that perform logical operations such as OR, XOR, AND, Shift and Rotate. Outputs from the adders 32 and PLUs are provided to a multiplexer 36 which selects a particular signal to be placed on a multi-drop bus 38.

The logical operations performed by the PLUs 34 often are faster than arithmetic operations performed by the adders 32. Using a multi-stage multiplexer 36 as shown, for example, in FIG. 7 can improve the multiplexer's overall speed of operation. The multiplexer 36 includes two stages. The first-stage includes five tri-state buffers 48 which can be implemented as the first-stage buffers 18 discussed above. Each first stage-buffer 48 receives data from the PLUs 34 and can be enabled or disabled using a respective control signal. One of the data lines coupled to the first-stage buffers 48 is selected so that the signal appearing on that data line is propagated to the second-stage buffer 50 through an intermediate multi-drop bus 40. At any given time, only one of the first-stage buffers 48 drives the bus 40. The second-stage buffer 50 can be implemented as the final stage buffer 22 discussed above. Therefore, the first stage buffers 48 and the second-stage buffer 50 can take advantage of the features discussed above with respect to FIG. 2.

Outputs from the adders 32, such as results from addition or subtraction operations, are provided to data lines that are coupled directly to additional second stage buffers 42, 44. The second stage buffers 42, 44 can be implemented, for example, by tri-state buffers, each of which has a single output.

Multiplexing the data lines that are coupled to the first-stage buffers 48 can be performed, for example, while arithmetic operations are being completed by the adders 32. One of the second-stage buffers 42, 44, 50 then can be enabled so that the signal from the selected data line is provided to the multi-drop bus 38. In other words, results from faster logical operations can be multiplexed separately before being multiplexed with results from slower arithmetic operations.

Figure 7:
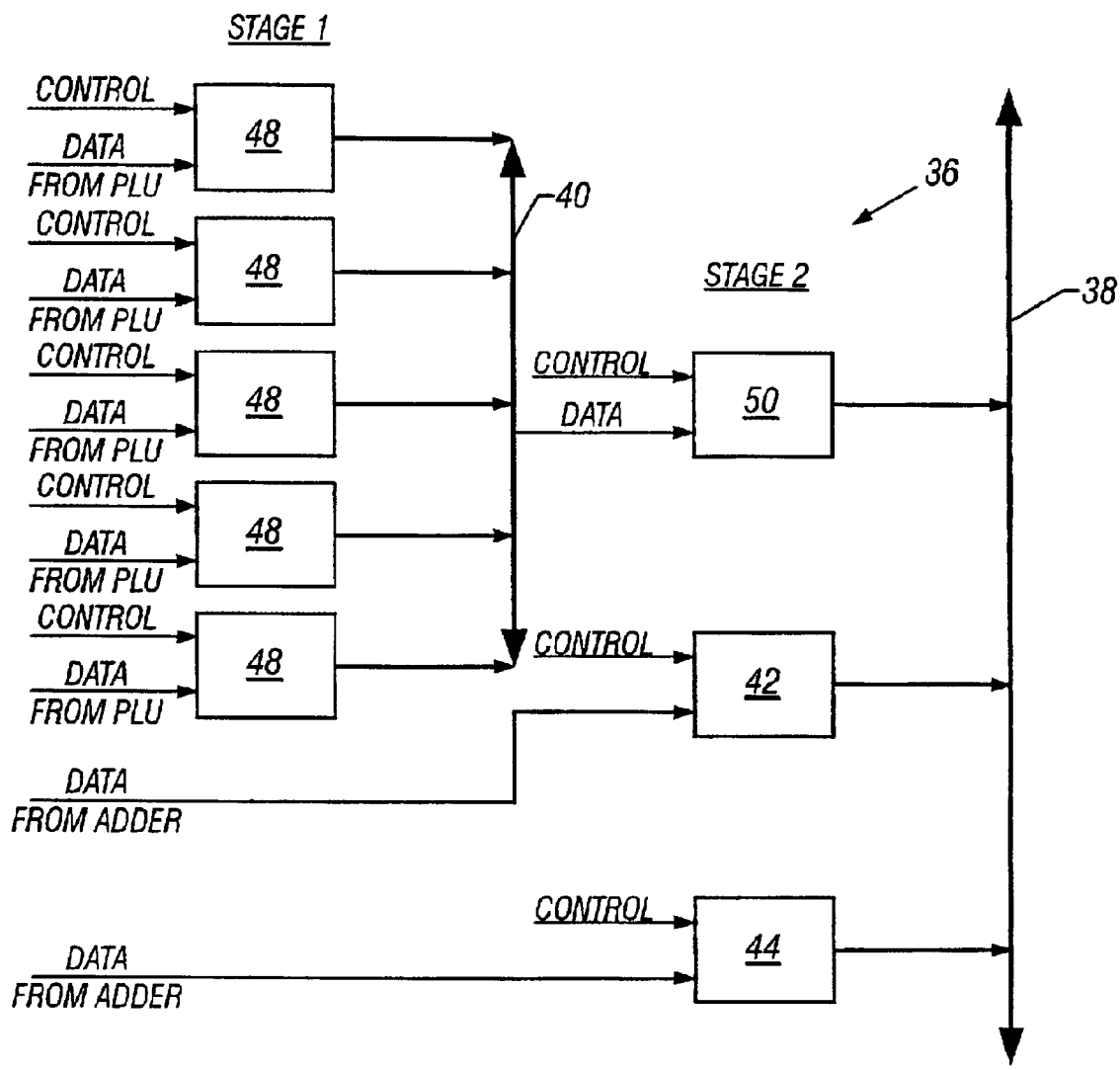
FIG. 7 illustrates a two-stage multiplexer.

Although the implementation illustrated in FIG. 7 includes only two stages, some implementations may include more than two stages.

Similarly, multiplexers like those described above can be used in electronic circuits and devices other than ALUs and microprocessors.

Other implementations are within the scope of the following claims.

What is claimed is:

1. A multiplexer comprising:
    a first stage including tri-state buffers, each of which has split outputs;
    a final stage including a tri-state buffer having an output; and
    circuitry configured to enable or disable a signal at an input of a selected one of the first-stage buffers to propagate to the output of the final-stage buffer;
    wherein the split outputs of the first-stage buffers are coupled directly to inputs of the final-stage buffer.

2. The multiplexer of claim 1 wherein each of the final-stage buffers includes three NMOS and three PMOS transistors.

3. The multiplexer of claim 1 wherein the multiplexer is static.

4. A multiplexer comprising:
    stages including a first stage, at least one intermediate stage, and a final stage having an input;
    the first stage and the at least one intermediate stage including tri-state buffers each of which has a pair of segregated outputs coupled to a subsequent stage; and
    control circuitry to enable or disable a signal at an input of a selected one of the first-stage buffers to propagate to the output of the final-stage buffer;
    wherein each first-stage buffer includes N transistors and each intermediate-stage buffer includes N-2 transistors, wherein N is a positive integer.

5. A multiplexer comprising:
    stages including a first stage, at least one intermediate stage, and a final stage having an input;
    the first stage and the at least one intermediate stage including tri-state buffers each of which has a pair of segregated outputs coupled to a subsequent stage; and control circuitry to enable or disable a signal at an input of a selected one of the first-stage buffers to propagate to the output of the final-stage buffer;

wherein:

each first-stage buffer is configured for receiving a respective data signal and a respective control signal;

assertion of the control signal for a particular first-stage buffer causes the data signal to be passed to one of that buffer's segregated outputs; and de-assertion of the control signal for the particular buffer causes the segregated outputs to be in a floating state.

6. The multiplexer of claim 5, wherein at least one intermediate-stage buffer has inputs coupled to outputs of buffers of a preceding stage, and each intermediate-stage buffer is configured for receiving a respective control signal and a data signal from a particular one of the preceding-stage buffers whose control signal is asserted, wherein assertion of the control signal for a particular intermediate-stage buffer causes the data signal from the preceding-stage buffer to be passed to one of the segregated outputs of the particular intermediate-stage buffer, and wherein de-assertion of the control signal for the particular intermediate-stage buffer causes both segregated outputs of the particular intermediate-Stage buffer to be in a floating state.

7. An apparatus comprising:

an arithmetic logic unit including an adder and a programmable logic unit;

a static multiplexer arranged to receive data signals from the adder and the programmable logic unit; and a bus coupled to an output of the multiplexer;

the multiplexer including:

a first stage including tri-state buffers each of which has split outputs;

a final stage including a tri-state buffer having an output; and circuitry configured to enable or disable a signal at an input of a selected one of the first-stage buffers to propagate to the output of the final-stage buffer;

wherein the split outputs of the first-stage buffers are coupled directly to inputs of the final-stage buffer.

8. An apparatus comprising:

an arithmetic logic unit including an adder and a programmable logic unit, a static multiplexer arranged to receive data signals from the adder and the programmable logic unit; and a bus coupled to an output of the multiplexer, the multiplexer including:

a first stage including tri-state buffers each of which has split outputs;

a final stage including a tri-state buffer having an output;

an intermediate stage coupled between the first stage and the final stage, the intermediate stage including tri-state buffers each of which has split outputs; and circuitry configured to enable or disable a signal at an input of a selected one of the first-stage buffers to propagate to the output of the final-stage buffer;

wherein the split outputs of each first-stage buffer are coupled directly to inputs of one of the intermediate-stage buffers, and wherein the split outputs of each intermediate-stage buffer are coupled directly to inputs of the final-stage buffer.

9. An apparatus comprising:

an arithmetic logic unit including an adder and a programmable logic unit, a static multiplexer arranged to receive data signals from the adder and the programmable logic unit; and a bus coupled to an output of the multiplexer, the multiplexer including:

a first stage including tri-state buffers each of which has split outputs;

a final stage including a tri-state buffer having an output;

an intermediate stage coupled between the first stage and the final stage, the intermediate stage including tri-state buffers each of which has split outputs, wherein each of the intermediate-stage buffers includes three NMOS and three PMOS transistors; and circuitry configured to enable or disable a signal at an input of a selected one of the first-stage buffers to propagate to the output of the final-stage buffer.

10. An apparatus comprising:

an arithmetic logic unit including an adder and a programmable logic unit, a static multiplexer arranged to receive data signals from the adder and the programmable logic unit;

a bus coupled to an output of the multiplexer; and control circuitry;

wherein the multiplexer includes stages including a first stage, an intermediate stage, and a final stage including an output;

wherein the first stage and the intermediate stage include tri-state buffers each of which has a pair of segregated outputs coupled to a subsequent stage and each includes three PMOS and three NMOS transistors;

wherein the control circuitry is configured to enable or disable a signal at an input of a selected one of the first-stage buffers to propagate to the output of the final-stage buffer.

11. An apparatus comprising:

an arithmetic logic unit including an adder and a programmable logic unit, a static multiplexer arranged to receive data signals from the adder and the programmable logic unit;

a bus coupled to an output of the multiplexer; and control circuitry;

wherein the multiplexer includes stages including a first stage, an intermediate stage, and a final stage including an output;

wherein the first stage and the intermediate stage include tri-state buffers each of which has a pair of segregated outputs coupled to a subsequent stage;

wherein the control circuitry is configured to enable or disable a signal at an input of a selected one of the first-stage buffers to propagate to the output of the final-stage buffer;

wherein each first-stage buffer is configured for receiving a respective data signal and a respective control signal;

wherein assertion of the control signal for a particular first-stage buffer causes the data signal to be passed to one of that buffer's segregated outputs;

wherein de-assertion of the control signal for the particular buffer causes that buffer's segregated outputs to be in a floating state.

12. The apparatus of claim 11 wherein:

each intermediate-stage buffer is configured for receiving a respective control signal and for receiving a data signal from a particular one of the preceding-stage buffers whose control signal is asserted;

assertion of the control signal for a particular intermediate-stage buffer causes the data signal from the preceding-stage buffer to be passed to one of the segregated outputs of the particular intermediate-stage buffer; and de-assertion of the control signal for the particular intermediate-stage buffer causes that buffer's segregated outputs to be in a floating state.

13. A method comprising:

causing a signal at an input to a selected one of a plurality of tri-state buffers within a multiplexer to be passed to a particular one of a pair of split outputs associated with the selected buffer; and receiving the signal directly from the particular split output in a first subsequent tri-state buffer coupled to the selected tri-state buffer.

14. The method of claim 13 including asserting a control signal for the selected buffer and de-asserting control signals for other ones of the plurality of tri-state buffers.

15. The method of claim 14 including selectively passing the signal from the first subsequent tri-state buffer to a multi-drop bus.

16. The method of claim 14 including:

selectively passing the signal to a particular one of a pair of split outputs associated with the first subsequent tri-state buffer; and receiving the signal from the particular split output of the first subsequent tri-state buffer in a second subsequent tri-state buffer.

17. The method of claim 14 including selectively passing the signal through a plurality of cascaded tri-state buffers each of which has split outputs.

18. A method comprising:

receiving signals representing results of arithmetic and logical operations; and causing a selected one of the signals to pass through a plurality of cascaded tri-state buffers within a multiplexer each of which has split outputs;

wherein each of the plurality of cascaded tri-state buffers after an initial tri-stage buffer is directly coupled to the split outputs of the preceding tri-state buffer.

19. The method of claim 18 including asserting control signals associated with the cascaded buffers through which the selected signal passes.

20. The method of claim 19 including passing the selected signal to a multi-drop bus.

21. A multiplexer comprising:

a first stage including tri-state buffers, each of which has split outputs;

a final stage including a tri-state buffer having an output;

an intermediate stage coupled between the first stage and the final stage including tri-state buffers, each of which has split outputs; and circuitry configured to enable or disable a signal at an input of a selected one of the first-stage buffers to propagate to the output of the final-stage buffer;

wherein the split outputs of each first-stage buffer are coupled directly to inputs of one of the intermediate-stage buffers;

wherein the split outputs of each intermediate-stage buffer are coupled directly to inputs of the final-stage buffer.

22. The multiplexer of claim 21 wherein each of the intermediate-stage buffers includes three NMOS and three PMOS transistors.

* * * * *